United States Patent [19]

Stegenga

[11] Patent Number: 4,652,969
[45] Date of Patent: Mar. 24, 1987

[54] SECURE UNIVERSAL HOUSING ARRANGEMENT FOR ENCLOSING ELECTRONIC CIRCUITS

[75] Inventor: Jerry A. Stegenga, Coral Gables, Fla.

[73] Assignee: Racal Data Communications Inc., Sunrise, Fla.

[21] Appl. No.: 752,280

[22] Filed: Jul. 5, 1985

[51] Int. Cl.4 ............................................. H05K 7/20
[52] U.S. Cl. .................................... 361/384; 206/328; 220/4 E; 220/4 F; 361/415; 361/399
[58] Field of Search .................. 206/328, 334; 211/41; 220/4 B, 4 E, 4 F; 312/257 SM; 361/383, 384, 395, 399, 415

[56] References Cited

U.S. PATENT DOCUMENTS

| | | | |
|---|---|---|---|
| 2,649,991 | 8/1953 | Woock | 220/60 |
| 2,744,650 | 5/1956 | Woessner | 220/4 E |
| 2,899,097 | 8/1959 | Haskins | 220/4 E |
| 3,147,943 | 9/1964 | Oldenburg et al. | 248/2 |
| 3,208,620 | 9/1965 | Herdering | 220/4 E |
| 3,687,325 | 8/1972 | Simons | 220/4 R |
| 3,774,984 | 11/1973 | Banko et al. | 312/8 |
| 3,913,774 | 10/1975 | Vajtay | 220/4 R |
| 4,061,228 | 10/1977 | Johnson | 206/454 |
| 4,089,464 | 5/1978 | Teti, Jr. et al. | 220/4 F |
| 4,102,557 | 7/1978 | Lee et al. | 220/DIG. 25 |
| 4,163,503 | 8/1979 | McKinnon | 220/18 |
| 4,210,252 | 7/1980 | Cooke et al. | 220/4 F |
| 4,215,796 | 8/1980 | Johnston et al. | 220/306 |
| 4,219,693 | 8/1980 | French | 174/135 |
| 4,220,252 | 9/1980 | Beall et al. | 220/307 |
| 4,356,531 | 10/1982 | Marino et al. | 361/384 |
| 4,421,246 | 12/1983 | Schultz et al. | 220/307 |
| 4,506,785 | 3/1985 | Seefeldt | 206/334 |
| 4,585,122 | 4/1986 | Stegenga | 206/334 |

Primary Examiner—A. D. Pellinen
Assistant Examiner—Gregory P. Thompson
Attorney, Agent, or Firm—Jerry A. Miller

[57] ABSTRACT

A secure snap together univeral housing arrangement according to the present invention includes identical upper and lower housing members having latch receiving apertures on the upper and lower surfaces. A plurality of circuit cardguides are disposed within the housing and include latching members which engage the latch receiving apertures. The circuit cardguides are preferably also identical and are used to fix various circuit cards in place. Front and rear panels snap into place using resilient latches also and include ledges along the upper and lower edges which engage lips on the upper and lower housing members to provide for secure engagement of the upper and lower housing members together. Assembly may be accomplished without use of any specialized tools and disassembly requires the use of a simple tool to pry the front panel out of engagement with the remainder of the housing.

11 Claims, 6 Drawing Figures

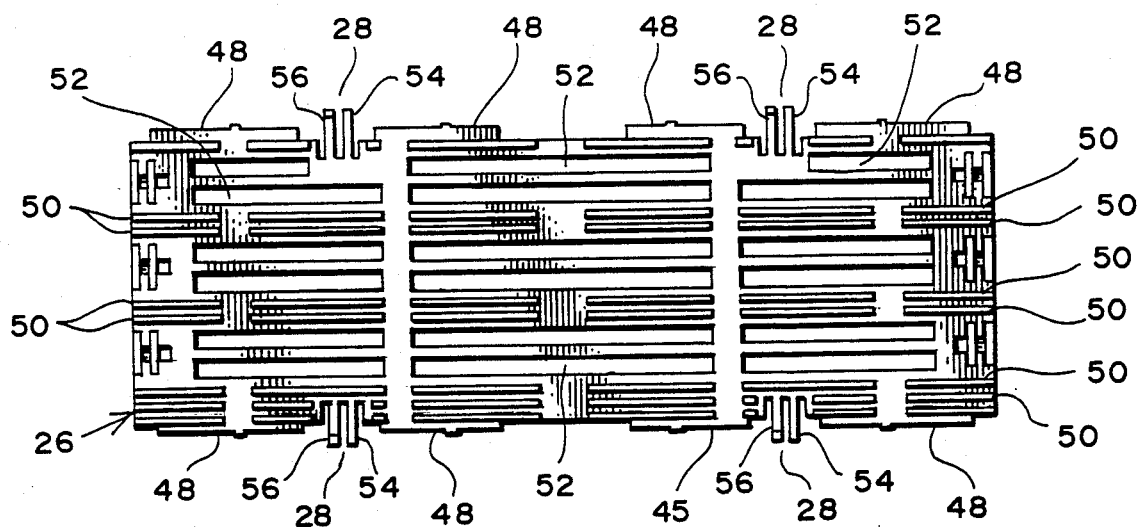
FIG. 3
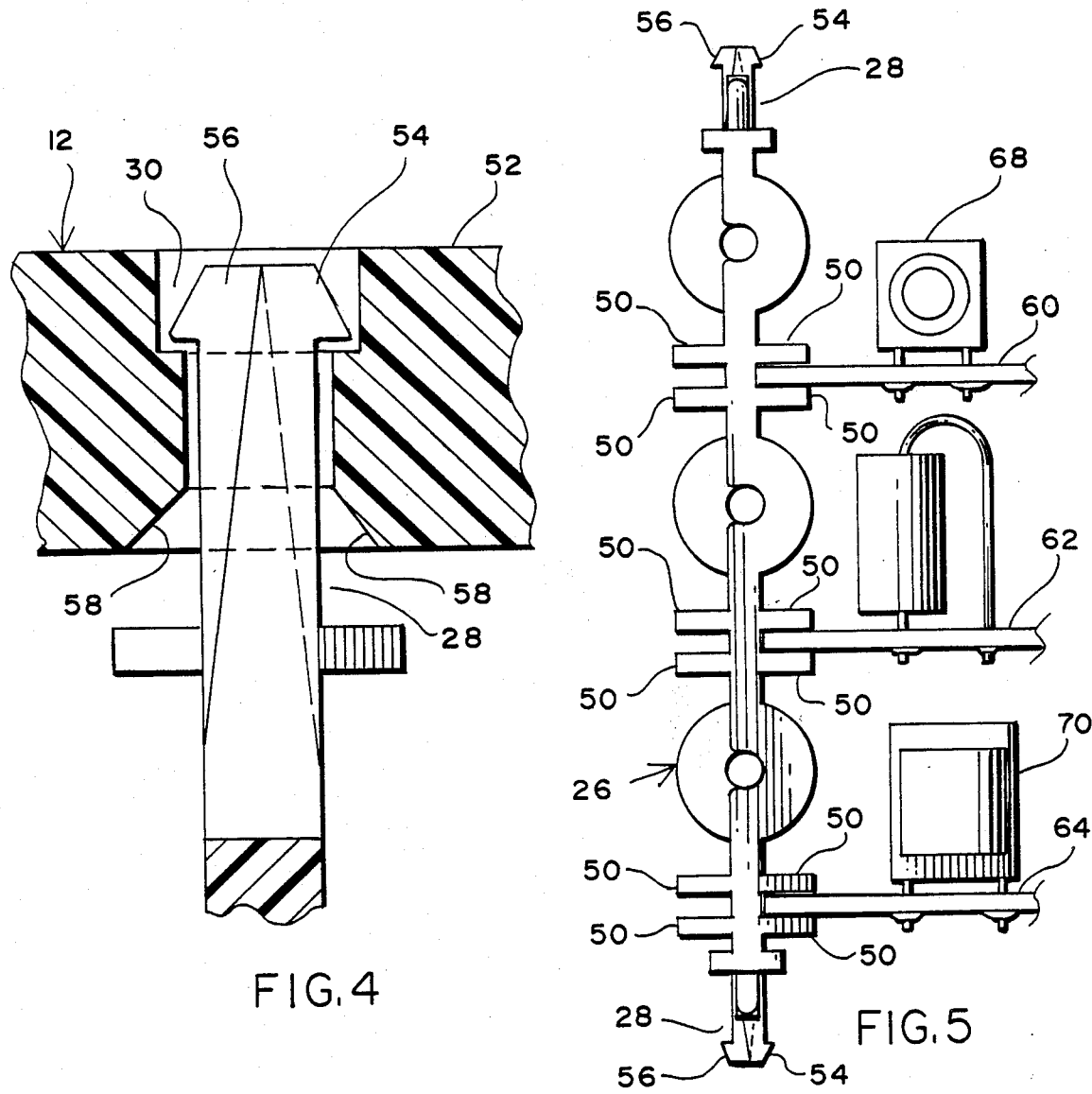
FIG. 4
FIG. 5

SECURE UNIVERSAL HOUSING ARRANGEMENT FOR ENCLOSING ELECTRONIC CIRCUITS

CROSS-REFERENCE TO RELATED APPLICATIONS

U.S. patent application Ser. No. 06/695,666 filed on Jan. 28, 1985, now issued U.S. Pat. No. 4,585,122 issued Apr. 29, 1986, entitled "Secure Housing Arrangement for Electronic Apparatus" shares common inventorship with the present invention and is assigned to Racal Data Communications Inc. which is the assignee of the present invention. The contents of this patent application is incorporated by reference as though disclosed fully herein. Both of these inventions are related to secure housing arrangements for enclosing electronic devices.

BACKGROUND

1. Field of the Invention

This invention relates generally to the field of universal secure housing arrangements for enclosing electronic circuit boards or the like. More particularly, this invention relates to a low cost housing for electronic circuit boards which may be configured in a variety of ways to accommodate a variety of circuit board configurations and requires no tools to assemble yet requires tools to disassemble.

2. Background of the Invention

In order to reduce the cost of housing various types of electronic equipment such as modems, multiplexers, encryption devices and the like it is frequently desirable to provide a single housing configuration which may be adapted to the needs of varying circuit board configurations. When it is possible to provide a common universal housing for a variety of electronic equipment, increased volume of purchase of the universal housing reduces the cost of producing such electronic equipment. In addition, inventory costs for maintaining stocks of a great variety of housings can be substantially reduced thereby further reducing product costs. It is also desirable to provide for ease of assembly of such a univeral housing by requiring that no tools be necessary to accomplish assembly. This goal is frequently contradictory to a desire to provide a degree of tamper resistance to the device. A degree of tamper resistance makes access to possibly hazardous voltages within the housing more difficult thus enhancing the safety of the electronic device and reducing the hazard of shock or fire.

In fact, product safety organizations such as the Canadian Standards Association (CSA) and Underwriter Laboratories (UL) have established standards for such enclosures. CSA's standard for data processing equipment for customer and commercial products C22.2 No. 154-M1983 and UL478 Standards for Information Processing and Business Equipment are two such standards for so called secured housings. It is advantageous for both safety and business considerations to enclose electronics devices inside housings which meet these types of specifications.

Several examples of fastening arrangements which are typically used to satisfy the requirements of such standards are ordinary screw fastener arrangements or quarter turn coin operated fasteners. Unfortunately, there are serious cost drawbacks in utilizing either of these common fastening arrangements. In the case of screw fasteners, although the part cost is nominal, the labor associated with assembling a screw assembled enclosure is considerable. In the case of quarter turn coin operated fasteners, parts cost is relatively higher and the degree of security obtained is somewhat limited due to the many types of devices (including coins) which can be used to open such fasteners. Additionally, serious damage to electronic circuits may occur due to short circuits if such metal fasteners are accidentally dropped or left inside such housings when reassembled.

While resilient latches of various arrangements have been used for assembling various types of plastic contains of the past, the present invention utilizes a resilient plastic latching arrangement which allows for inexpensive ABS type plastic to be used abundantly while providing a secure enclosure with exceedingly low parts and labor cost. In addition, the present invention provides for a high degree of tamper resistance.

The present invention also provides for ready adaptation to a great number of possible circuit board configurations including the capability of handling a plurality of circuit boards of varying sizes while largely avoiding the necessity for modification to the basic housing arrangement.

SUMMARY OF THE INVENTION

It is an object of the present invention to provide an improved secure housing arrangement for providing secure enclosure of electronic circuitry and the like.

It is another object of the present invention to provide a housing arrangement with inner support for printed wiring boards and the like.

It is another object of the present invention to provide a low cost housing assembly for electronic circuitry.

It is another object of the present invention to provide a tamper resistant enclosure for electronic circuitry.

It is another object of the present invention to provide a universal housing arrangement which uses a minimal amount of tooling to manufacture.

It is a further object of the present invention to provide a universal housing assembly which may accommodate varying sizes and configurations of circuit boards while substantially avoiding modification to the basic housing design.

It is an advantage of the present invention to allow low cost types of plastic to be used for the majority of parts in a snap together enclosure.

It is another advantage of the present invention that the enclosure can be quickly assembled without tools but cannot be disassembled without use of tools, thereby decreasing assembly costs while discouraging tampering.

It is another advantage of the present invention that varying sizes of circuit boards can be accommodated without modification to the housing.

These and other objects and advantages of the invention will become apparent to those skilled in the art upon consideration of the following description of the invention.

In one embodiment of a universal housing arrangement an upper housing member has a front and rear edge, a first inner surface and an upper surface with a first latch receiving member disposed on the first inner surface. A lower housing member similar to the upper housing member has front and rear edges, a second inner surface and a lower surface with a second latch receiving member disposed on the first inner surface.

First and second side panels are coupled to at least one of the upper and lower housing members and each has a third inter surface including third latch receiving members. Four lip structures, one disposed adjacent each of the edges and adjacent one of the first and second inner surfaces of the upper and lower housing members are attached to the upper and lower housing members. A cardguide is situated between the upper and lower housing members and includes first and second latches suitable for engaging the first and second latch receiving members respectively in a manner which releasably holds the upper and lower housing members together. Front and rear panels each include third latching members suitable for releasably engaging the third latch receiving members to hold the front and rear panels in fixed physical relationship with the upper and lower housing members. Four lip receiving structures, two coupled to each of the front and rear panels, engage the lip members in a manner suitable for resisting separating forces applied between the upper and lower housing members.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

BRIEF DESCRIPTION OF THE DRAWINGS

FIG. 3 is a side view of the circuit cardguide used in the preferred embodiment of the present invention.

FIG. 4 is a detailed cutaway drawing of the latching mechanism which connects the circuit cardguide to the upper and lower housing members of the present invention.

FIG. 5 is a front view of the circuit cardguide of the present invention illustrating captivation of three circuit cards therein.

DETAILED DESCRIPTION OF THE PREFERRED EMBODIMENT

Figure 1:
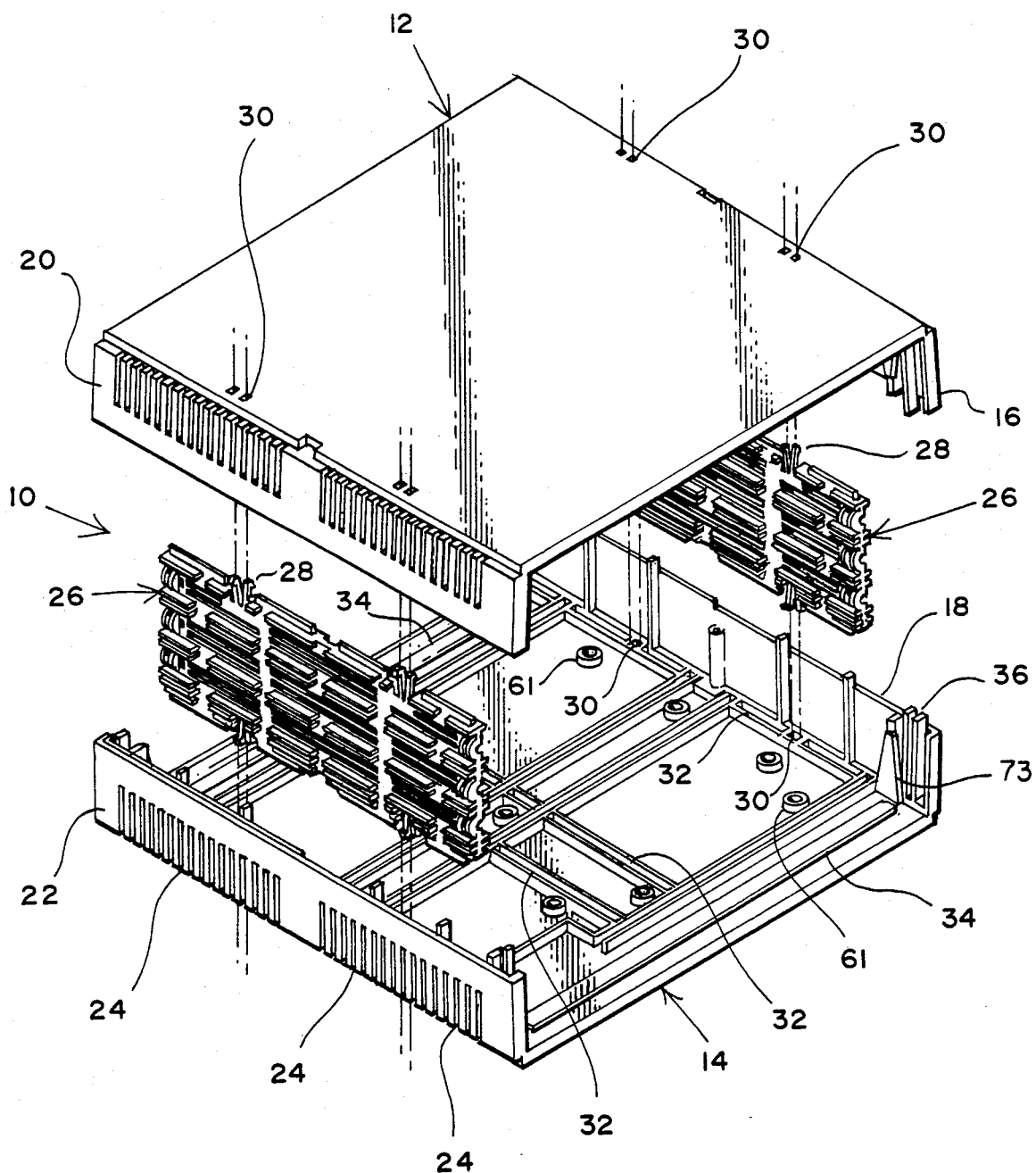
FIG. 1 is an exploded view of a portion of the housing of the present invention which illustrates the first stage of assembly of the present housing.

Referring now to the drawings, wherein in like reference numerals designate identical or corresponding parts through the several views, and more paticularly to FIG. 1 thereof, an exploded view of the housing or enclosure according to the present invention is shown and designated generally as 10. For clarity of illustration, circuit boards or other internal structures which the housing may be used to enclose are not shown in FIG. 1. Housing 10 includes an upper enclosure member 12 along with a lower enclosure member 14. Side walls of the enclosures are formed by integral half walls 16 and 18 of enclosure members 12 and 14, respectfully. Similarly, half walls 20 and 22 of enclosure members 12 and 14 form the other side wall of housing 10.

The housing 10 may also include one or more venting apertures 24 to provide for convection cooling of the enclosed electronic circuits. In one embodiment, apertures are provided on top and bottom of both sides of the housing as shown to facilitate convection cooling. In another embodiment, apertures are provided, for example, on the upper left and lower left and a fan is provided inside the housing to provide forced air cooling. False vents may be used to enhance the aesthetics in this embodiment. Other variations will occur to those skilled in the art.

In a rectangular box type of housing as shown in FIG. 1, the large majority of raw material of the housing 10 is contained in the upper and lower enclosure members 12 and 14. It is therefore desirable to utilize low cost materials such as ABS plastics (for example Borg Warner TM KJW or Monsanto TM 911 brands of ABS plastics) for housing members 12 and 14. While cost considerations dictate that such plastics should be used for enclosures, such materials have a number of inherent disadvantages when attempting to eliminate conventional fasteners such as screws in favor of resilient snap together plastic type of assemblies. One such disadvantage is the inability to cope with high stresses which is typical of such ABS plastics. The present invention advantageously circumvents these difficulties while retaining extensive use of inexpensive ABS plastic. Cardguides 26 are made of ABS plastic and utilize snap latches 28 which mate with latch receiving apertures 30 in the upper and lower housing members. By limiting the deflection of snap latches 28 (to approximately 0.030 inches in the preferred embodiment) and utilizing a relatively long lever arm to be deflected (approximately 0.4 inches in the preferred embodiment) ABS plastic will provide adequate resilience to provide a non-secure fastening mechanism without unacceptable strain (less than 2.5% in the preferred embodiment).

Upper and lower housing members 12 and 14 each include a plurality of tracks 32 which are used to align and captivate any appropriate number of cardguides 26 to accommodate circuit boards of varying widths. In the preferred embodiment, apertures 30 for receiving latches 28 are provided only on the outermost tracks so that the outermost cardguides 26 are used to hold the upper and lower housing members 12 and 14 together. Cardguides may also be disposed along inner tracks 32 to accommodate circuit cards of varying widths. Tracks 32 may or may not include apertures for captivating latches 28.

In the first stage of assembly of the present housing, cardguides 26 are latched into upper and lower housing members 12 and 14 as shown thereby holding the upper and lower housing members 12 and 14 in a fixed relationship with one another so that circuit cards can be inserted in the cardguides. Circuit cards are not shown in FIG. 1 to enhance the clarity of the drawing. Latches 28 provide a relatively low degree of resistance to separation of upper and lower housing members 12 and 14 but serve primarily to hold the sub-assembly together until the assembly is completed. In addition, it provides resistance to accidental disassembly due to picking up the sub-assembly by only the upper housing member 12.

Figure 2:
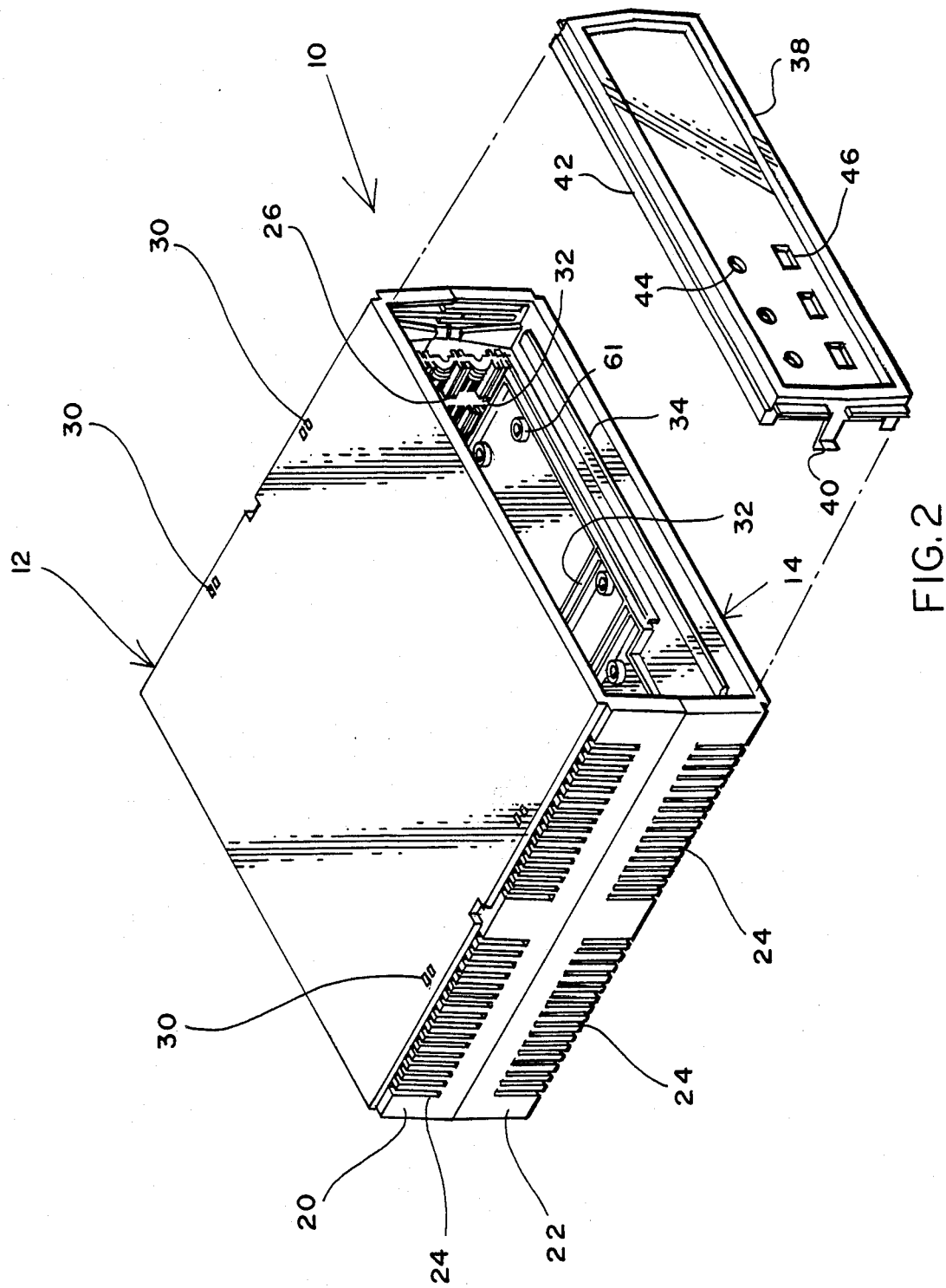
FIG. 2 is also an exploded view of the present invention illustrating the last step in assembly of the present housing.

Turning now to FIG. 2 viewed in conjunction with FIG. 1 the upper and lower housing members 12 and 14 are seen to include a lip 34 running along the length of the front and rear edges of both the upper and lower housing members. Lip 34 operates in conjunction with latch receiving portion 36 to provide secure closing of the housing when front and rear panels 38 are installed. The rear panel is not shown in the present illustration but is substantially similar to front panel 38.

Front panel 38 is preferably made of a resilient material such as General Electric Lexan TM 940 polycarbonate and is snapped in to engagement with the side walls of housing 10 as shown in FIG. 2. Front panel 38 includes resilient latch members 40 which engage latch receiving portions 36 to hold the front panel in engagement with the remainder of housing 10. In addition, a ledge 42 is provided on the upper and lower edges of front panel 38 which slides under lip portion 34 thereby completing the locking of upper and lower housing members 12 and 14. Primary resistance to separating forces applied to upper and lower housing members 12 and 14 is provided by the engagement of ledge 42 with lip 34.

Circuit boards are also not shown in FIG. 2 but are understood to be installed in cardguides 26 by simply sliding the cards in place. The circuit cards may include various switches and indicators mounted to a front or rear surface thereof or connectors which may protrude through apertures such as 44 and 46 in front panel 38. Similarly such provisions may be made with the rear panel of housing 10.

One skilled in the art will recognize that front panel 38 may include a standard maximum number of apertures 44 and 46 which will accommodate a large variety of switches, displays, connectors, etc., for various electronic circuits. Unused apertures may then be covered up either by plugs or by adhesive labels, appliques and the like to individualize the housing for each specific device to be enclosed.

By careful planning in the design of such a universal panel 38, the same panel can be used not only for both front and rear panels, but can be made to accommodate most if not all electronic devices to be housed. A single tool for molding the panel 38 may be advantageously designed to accept an insert which is used to produce the standard aperture configuration. In this manner, specialized designs for the aperture configuration may be accommodated inexpensively by simply providing a different insert design rather than requiring a completely new tool for each variation for the panel 38.

Turning now to FIG. 3, a side view of cardguide 26 is shown. Resilient latches 28 are preferably provided in pairs which latch to latch receiving apertures 30 in opposite directions. In addition, a plurality of tabs 48 are provided to engage channels 32 thereby easing assembly and assuring proper alignment of cardguides 26 within housing 10. Guiderails 50 are also provided to accommodate inseration of circuit board as will be more clearly illustrated later. Cardguide 26 also includes preferably a plurality of openings 52 which provide for good flow of cooling air within the housing assembly thereby preventing overheating of the circuitry contained therein.

Turning now to FIG. 4 the latching arrangement used to couple the cardguides to the housing members is shown in greater detail. Latch 28 is shown to include first and second latching members 54 and 56 which are made up of a wedge-like portion connected to the upper end of a lever arm structure. When engaged, the wedge-like portions of latching members 54 and 56 are situated just below the upper surface 57 of upper housing member 12. This coupled with small size of apertures 30 provides for a degree of inaccessability to the latching arrangement thus enhancing the security of the enclosure. The inner entrance to latch receiving apertures 30 includes tapered walls 58 which allow the latching members 54 and 56 to readily slide into engagement with the latch receiving aperture 30. During assembly, lever arms of the first and second latching members 54 and 56 beng slightly to conform with the shape of the inner walls of aperture 30 until full engagement is achieved. At this point the latch members snap into engagement with the housing. This type of latch configuration is similar in structure to that described in further detail in Ser. No. 06-695,666 which is incorporated by reference. In the preferred embodiment when full engagement is achieved only approximately 0.03 inches of overlap between the latch members and the latch receiving aperture is present to hold the latch in engagement. This provides for a relatively low level of protection against separation of the latch from the latch receiving aperture. This is desirable so that the housing can be readily disassembled even without use of a tool for prying the latch members out of engagement with the latch receiving apertures since the primary latching mechanism utilizes the lip and ledge as previously described. This is not to be limiting, however, since even greater security can be obtained by requiring a higher latching strength in the assembly of FIG. 4 and utilizing a more resilient material for the cardguides 26.

It should be noted that housing members 12 and 14 are provided with screw bosses 61 to accommodate designs which are not totally adaptable to the use of cardguides as will be described. Transformers, circuit boards, etc., may be secured to the housing by self tapping screws tapped into these screw bosses Turning now to FIG. 5, three circuit boards 60, 62 and 64 are shown engaged with the guiderails 50 of circuit cardguide 26. Preferably cardguide 26 is designed to be asexual in nature in that there is no front or back as such and is highly symetrical allowing the assembly worker to readily orient the cardguide 26 during assembly. This also allows for a single cardguide to function in a variety of ways without a great number of different cardguides being required to accommodate different electronic circuit boards.

It will be clear to those skilled in the art that cardguide 26 may be readily used either on the left or right side of housing 10 due to its symetrical nature and furthermore must only be oriented according to which edge of cardguide 26 faces up. This same cardguide may also be used in central areas of the housing to support circuit cards on both sides as will be clear to those skilled in the art. Of course, various other designs may be implemented which do not even require this degree of orientation by the assembler. The present cardguide arrangement may also be useful in creating a separate chamber for PC boards on one side and a power supply on the other. They may also be used to segregate various circuit functions or, for example, to isolate high voltage circuits from low voltage circuits.

Circuit board 60, 62 and 64 may contain various electronic components as required to implement the desired circuit function being housed. In the preferred embodiment these circuit elements may include display lights such as light emitting diode 68 and push button switches 70 which may protrude through apertures 44 and 46 of front panel 38. Similarly connectors such as RS 232 connectors and the like may be present on the circuit board and may protrude through front or rear panels.

Figure 6:
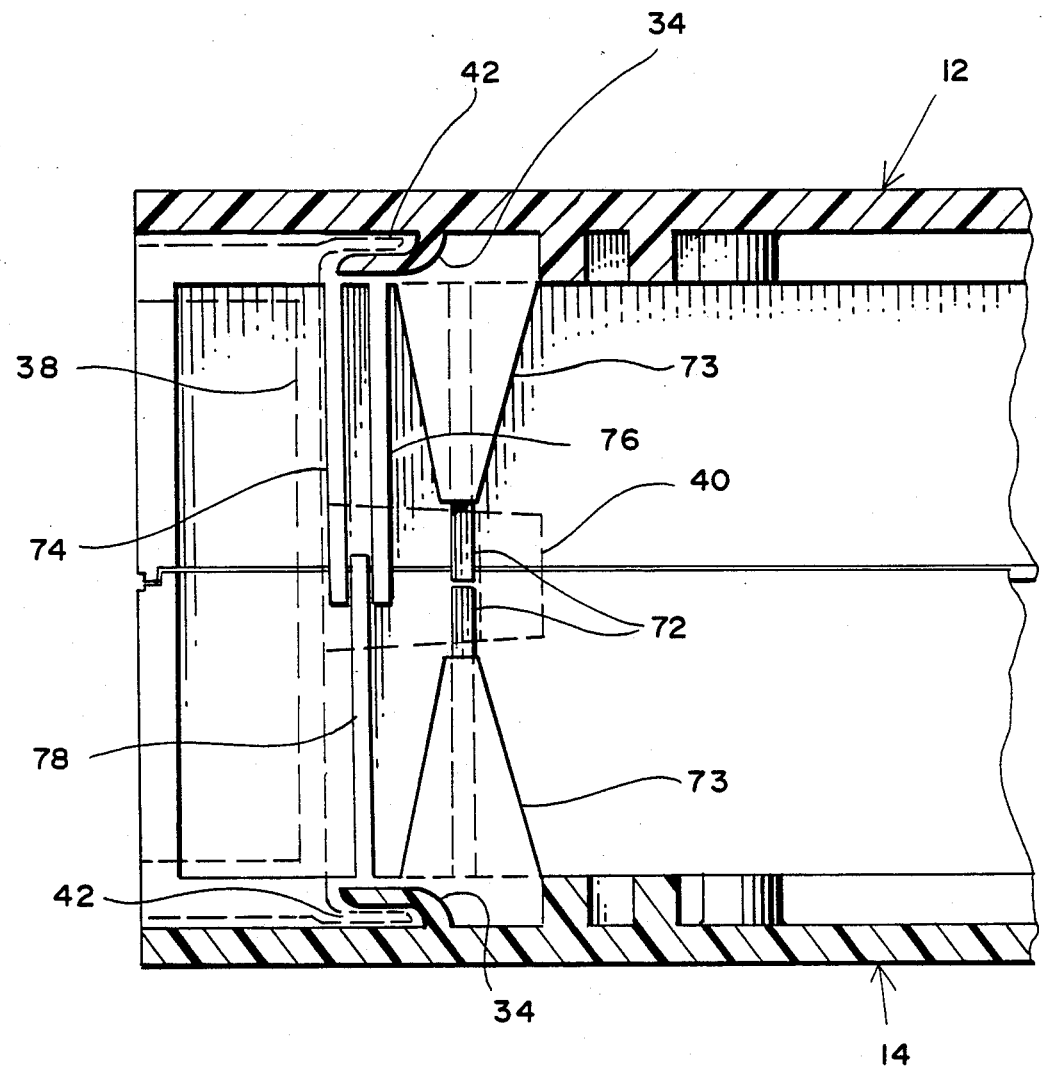
FIG. 6 is a cutaway view of the front or real panel engaged with the upper and lower housing members.

Turning now to FIG. 6 a cutaway view of the primary latching mechanism for holding the upper and lower housing members 12 and 14 into rigid engagement is illustrated. Front panel 38 is preferably configured similar to the front panel disclosed in U.S. Ser. No.

06/695,666 in that the front panel is recessed so that separating forces applied at the front panel in an attempt to separate upper and lower housing members 12 and 14 is fruitless. This aspect is discussed in detail in the above-referenced patent application which is incorporated by reference. When engaged, resilient latch member 40 snaps into engagement with a rigid rib 72 of latch receiving portion 36 to prevent the front panel from moving horizontally. Latch receiving portion 36 also includes trapezoidal reinforcements 73 in the preferred embodiment. Ledge 42 is captivated within lip 34 to securely lock housing members 12 and 14 together. Disassembly may be readily accomplished by inserting a thin bladed tool between the side wall of housing 10 and the front panel 38 adjacent the latch 40. Latch 40 then may be disengaged from rib 72 by prying it away from the rigid rib 72 and then sliding the panel 38 out of engagement with the housing members. This arrangement also has the advantage of preventing unauthorized access to the inside of the housing since the true latching mechanism which holds the housing together is obscured from view. That is, the latch 40 and associated parts are not visible to the user unless he happens to observe the disassembly of the device. The housing is therefore highly tamper resistant since the mechanism for opening the housing cannot be seen when the housing is fully assembled.

As shown in this illustration, together with FIG. 1, it is also possible to make upper housing member 12 and lower housing member 14 in an identical configuration so that it to is asexual in nature. Upper and lower housing members 12 and 14 may include a tongue and groove structure along its edges of sidewalls 20 and 22 so that, for example, sidewall 20 includes a tongue and sidewall 22 includes a groove. In this example, sidewall 16 would then include a groove and 18 a tongue so that rotation by 180° allows upper housing member and lower housing member 12 and 14 respectively to be identical parts. In a similar manner a front side of the housing members may include a pair of alignment posts 74 and 76 which engage a single alignment post 78. This also allows for 180° rotation to facilitate a common housing member to be used either as upper or lower housing members 12 or 14 respectively.

Thus, a single housing member can be used for both upper and lower housing member, a single cardguide can be utilized for any of a plurality of circuit card sizes and configurations and only a variety of front and rear panels may be required to utilize a single housing configuration for a variety of electronic devices. In fact, by utilizing only a minor degree of consistency in design of displays, switches, connectors, etc., the front and rear panels may also be reduced to a very low number of actual parts which must be maintained in inventory. Therefore, it is possible to implement the present housing arrangement using a total of three tools, thus producing a low cost universal secure housing arrangement with minimal tooling, assembly, material and inventory costs.

Thus it is apparent that in accordance with the present invention an apparatus that fully satisfies the objectives, aims and advantages as set forth above. While the invention has been described in conjunction with a specific embodiment, it is evident that many alternatives, modifications and variations will become apparent for those skilled in the art in light of the foregoing description. Accordingly it is intended that the present invention embrace all such alternatives, modifications and variations as fall within the spirit and broad scope of the appended claims.

What is claimed is:
1. A secure snap-together housing arrangement, comprising:
   an upper housing member (12) having front and rear edges, a first inner surface and an upper surface with a first latch receiving means (58, 30) disposed on said first inner surface;
   a lower housing member (14) having front and rear edges, a second inner surface and a lower surface with a second latch receiving means (58, 30) disposed on said second inner surface;
   first (16, 18) and second (20, 22) side panels integral with at least one of said upper and lower housing members (12, 14), said first and second side panels each having a third inner surface including third latch receiving means (36, 72);
   four lip members (34), one disposed adjacent each of said edges and adjacent one of said first and second inner surfaces of said upper and lower housing members (12, 14) respectively;
   circuit card holding means (26) situated between said upper and lower housing members, said circuit card holding means including first and second latching means (54, 56) for engaging said first and second latch receiving means (58, 30) respectively in a manner which releasably holds said upper and lower housing members together;
   front and rear panels (38), each including third latching means (40) for engaging said third latch receiving means (36, 72) to hold said front and rear panels (38) in fixed physical relationship with said upper and lower housing members (12, 14); and
   four lip receiving means (42), two coupled to each of said front and rear panels (38), for engaging said lip members (34) to resist separating forces applied between said upper and lower housing members (12, 14).

2. The housing of claim 1, wherein said upper and lower housing members (12, 14) are substantially identical.

3. The housing of claim 1, wherein said first, second and third latching means each include resilient latching means.

4. The housing of claim 1, further including:
   A circuit board (60, 62, 64) coupled to said circuit card holding means;
   A plurality of switches (70) and displays (68) situated on said circuit board and projecting through a corresponding plurality of apertures (44, 46) in said front panel (38).

5. The housing of claim 1, wherein said third latching means (40) is substantially totally obscured from view when said housing is completely assembled.

6. The housing of claim 1, wherein said first and second latching means (54, 56) provides a relatively low level of latching strength and said third latching means (40) provides a relatively high level of latching strength.

7. The housing of claim 4, further including ventilating means (24) for providing convection cooling of said circuit board.

8. The housing of claim 1, wherein said third latching means includes a resilient snap latch arrangement (40, 72).

9. The housing arrangement of claim 6, wherein said first and second latching means (54, 56) is made of a relatively rigid plastic and said third latching means (40) is made of a relatively resilient plastic.

10. The housing of claim 9, wherein said relatively rigid plastic is ABS plastic and said relatively resilient plastic is polycarbonate plastic.

11. A secure snap-together housing arrangement, comprising:

- an upper housing member (12) having front and rear edges, a first inner surface and an upper surface with a first latch receiving means (58, 30) disposed on said first inner surface;
- a lower housing member (14) substantially identical to said upper housing member and having front and rear edges, a second inner surface and a lower surface with a second latch receiving means (58, 30) disposed on said second inner surface;
- first (16, 18) and second (20, 22) side panels integral with at least one of said upper and lower housing members (12, 14), said first and second side panels each having a third inner surface including third latch receiving means (36, 72);
- a plurality of channels (32) disposed on said inner surfaces of said upper and lower housing members;
- four lip members (34), one disposed adjacent each of said edges and adjacent one of said first and second inner surfaces of said upper and lower housing members (12, 14) respectively;
- a plurality of circuit cardguides (26) situated between said upper and lower housing members in said channels, said circuit cardguides (26) including first and second resilient latching means (54, 56) for engaging said first and second latch receiving means (58, 30) respectively to hold said upper and lower housing members (12, 14) together;
- a circuit card (60, 62, 64) coupled to said plurality of circuit cardguides (26), said circuit card (60, 62, 64) including a plurality of displays (68) and switches (70) disposed thereon;
- front and rear panels (38), each including third resilient latching means (40) for releasably engaging said third latch receiving means (36, 72) to hold said front and rear panels (38) in fixed physical relationship with said upper and lower housing members (12, 14) in a manner which obscures said third latching means (40) from view when said housing is fully assembled;
- said front panel further including a plurality of apertures (44, 46) with said plurality of displays (68) and switches (70) protruding through said apertures; and
- four lip receiving means (42), two coupled to each of said front and rear panels (38) for engaging said lip members (34) to resist separating forces applied between said upper and lower housing members (12, 14).

* * * * *